(12) United States Patent
Ayele et al.

(10) Patent No.: US 10,794,856 B2
(45) Date of Patent: Oct. 6, 2020

(54) DETECTION DEVICE, IN PARTICULAR INCORPORATED IN A PH METER, AND CORRESPONDING PRODUCTION PROCESS

(71) Applicant: STMicroelectronics (Crolles 2) SAS, Crolles (FR)

(72) Inventors: Getenet Tesega Ayele, Sherbrooke (CA); Stephane Monfray, Eybens (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/275,051

(22) Filed: Feb. 13, 2019

(65) Prior Publication Data

US 2019/0250124 A1 Aug. 15, 2019

(30) Foreign Application Priority Data

Feb. 15, 2018 (FR) .................................... 18 51297

(51) Int. Cl.

| | |
|---|---|
| *G01N 27/414* | (2006.01) |
| *H01L 23/522* | (2006.01) |
| *G01N 27/416* | (2006.01) |
| *H01L 21/768* | (2006.01) |
| *H01L 29/423* | (2006.01) |

(52) U.S. Cl.
CPC ..... *G01N 27/4148* (2013.01); *G01N 27/4145* (2013.01); *G01N 27/4167* (2013.01); *H01L 21/768* (2013.01); *H01L 23/5226* (2013.01); *H01L 29/42356* (2013.01)

(58) Field of Classification Search
CPC .......... G01N 27/4148; G01N 27/4145; G01N 27/4167; H01L 23/5226; H01L 21/768; H01L 29/42356
See application file for complete search history.

(56) References Cited

U.S. PATENT DOCUMENTS

| | | |
|---|---|---|
| 2011/0299337 A1 | 12/2011 | Parris et al. |
| 2012/0001235 A1 | 1/2012 | Fife |
| 2015/0276667 A1* | 10/2015 | Klootwijk .......... G01N 27/4146 506/9 |
| 2016/0061772 A1* | 3/2016 | Rothberg ........... G01N 27/4148 506/38 |

OTHER PUBLICATIONS

INPI Search Report and Written Opinion for FR 1851297 dated Sep. 14, 2018 (8 pages).

* cited by examiner

*Primary Examiner* — Karen Kusumakar
(74) *Attorney, Agent, or Firm* — Crowe & Dunlevy

(57) ABSTRACT

A detection stage of an electronic detection device, for example a pH meter, includes an insulating region that receives an element to be analyzed. The insulating region is positioned on a sensing conductive region. A biasing stage includes an electrically conductive region which is capacitively coupled to the conductive region. The electrically conductive region is formed in an uppermost metallization level along with a further conductive region. That further conductive region is electrically connected to the sensing conductive region by a via passing through an insulating layer which insulates the electrically conductive region from the sensing conductive region.

19 Claims, 4 Drawing Sheets

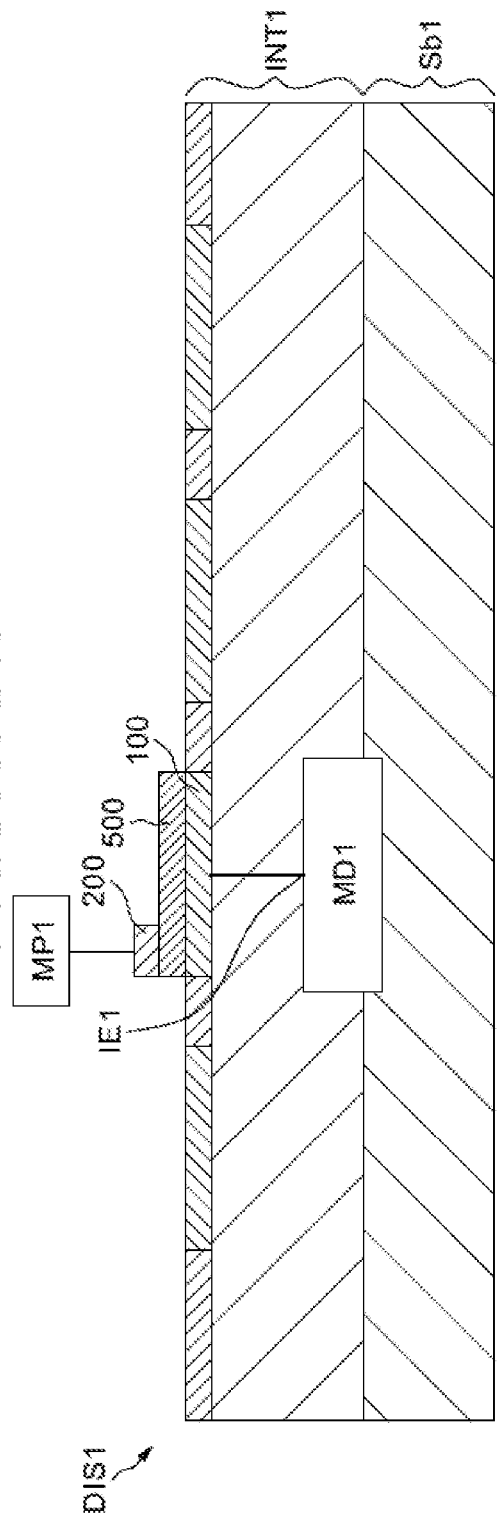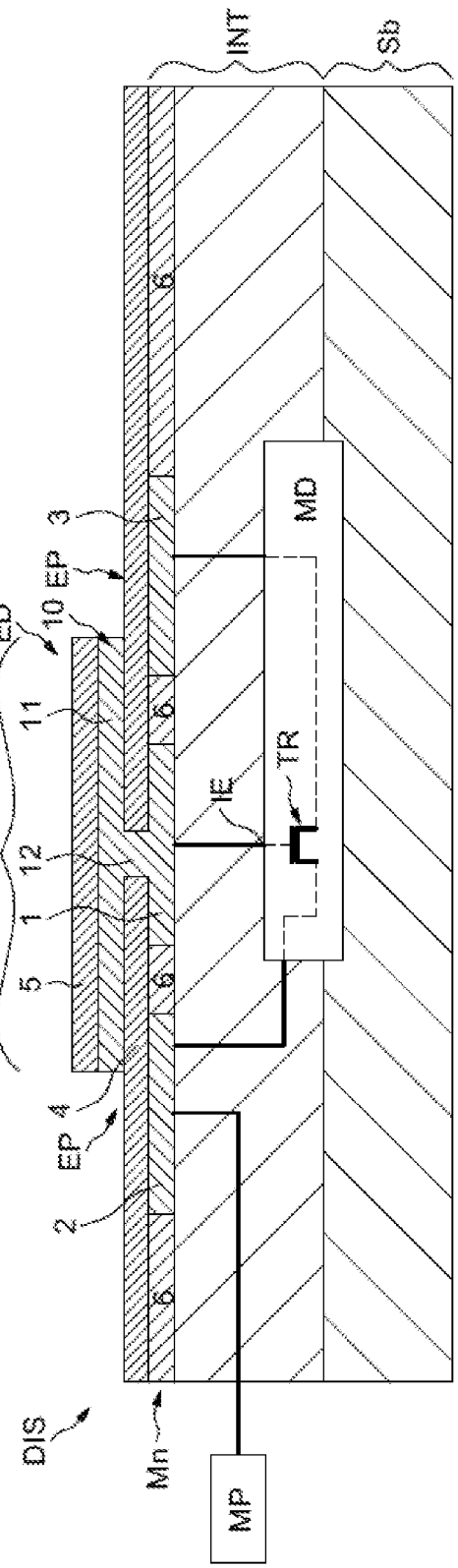

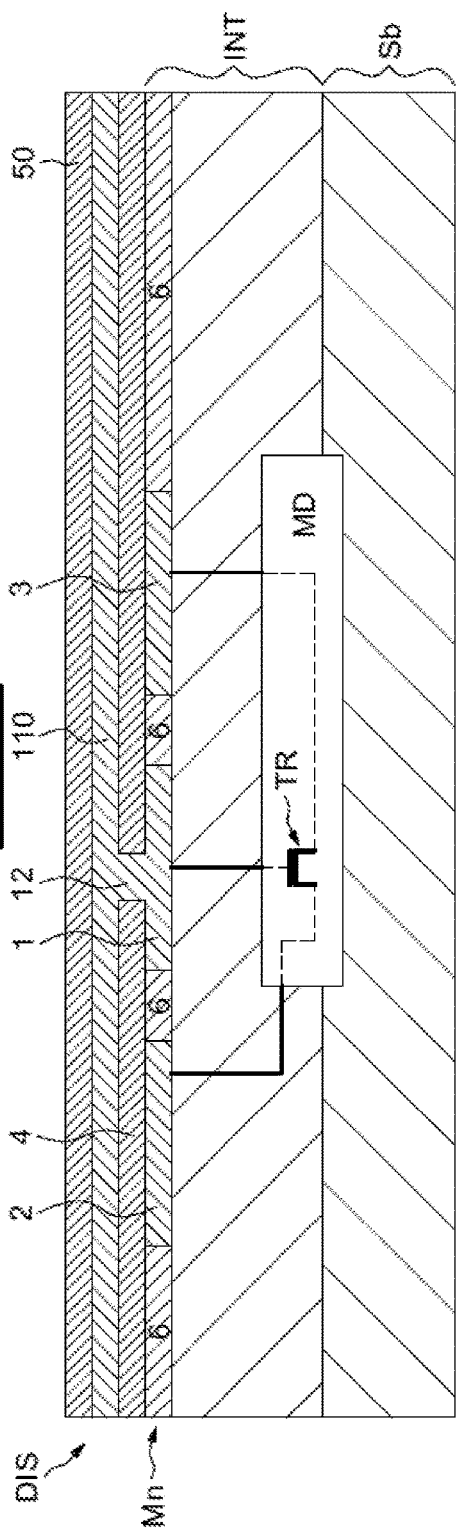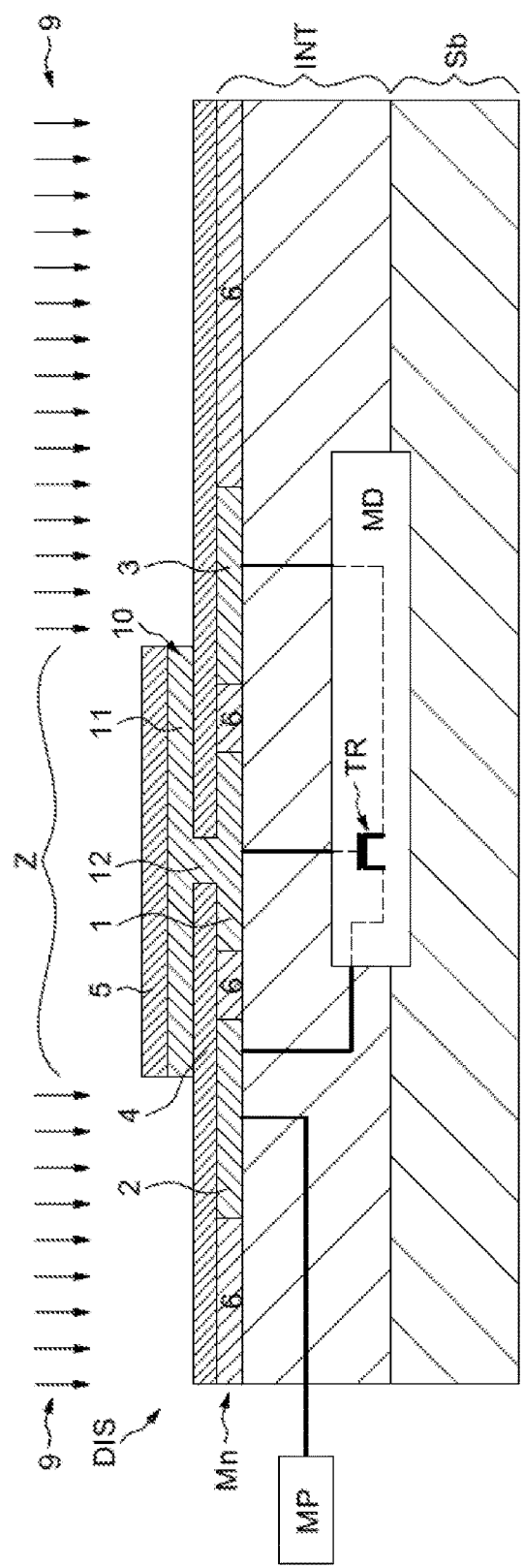

DETECTION DEVICE, IN PARTICULAR INCORPORATED IN A PH METER, AND CORRESPONDING PRODUCTION PROCESS

PRIORITY CLAIM

This application claims the priority benefit of French Application for Patent No. 1851297, filed on Feb. 15, 2018, the content of which is hereby incorporated by reference in its entirety to the maximum extent allowable by law.

TECHNICAL FIELD

Modes of implementation and embodiments relate to integrated circuits, and more particularly to integrated circuits capable of detecting small variations in electrical potential, for example, but without limitation, those caused by the detection of target molecules by a specific sensor in a lab-on-a-chip.

BACKGROUND

A lab-on-a-chip conventionally comprises a sensor of molecules that is connected to an electronic circuit configured to convert the data relating to the content of a fluid (a liquid or a gas) into electrical form. This item of data may be the presence or absence of a target molecule in the fluid, for example in the context of searching for a virus in a blood sample, or else the pH value of a solution.

Labs-on-a-chip employing field-effect transistors are known, in which a sensor of molecules is electrically connected to the gate of a transistor. Thus, the variation in potential caused by the detection of the target molecule of the sensor results in a variation in the drain current of the transistor.

FIG. 1 illustrates an existing detection device DIS, including a substrate Sb1 in and on which a detection module MD1 is produced, surmounted by an interconnection part INT1 (known as the BEOL: back end of line), and on the last level of which a detection stage, or sensor, is produced, which stage is coupled to the detection module.

In this detection device, the detection stage takes the form of an insulating region 500, produced in an insulating material on a conductive part 100, for example a copper contact pad, which part is coupled to an input interface IE1 of the detection module.

To allow a high level of accuracy of detection, the conductive part 100, i.e. the input interface of the detection module, should not be left at a floating potential.

Thus, the device DIS1 comprises a biasing stage comprising an electrode 200 produced on a part of the insulating layer, which is coupled to a biasing circuit MP1 allowing the potential of the contact pad 100 to be fixed by capacitive coupling.

This being so, the production of the electrode 200 on the insulating region 500 has some drawbacks, since it both exposes the insulating region to the etching steps in the process of producing the device, which risks damaging or contaminating the insulating material, and it decreases the area receiving the product to be analyzed.

There is therefore a need to provide a detection device having an input interface which is not at a floating potential, and having a detection area which is not decreased.

SUMMARY

According to one embodiment, an integrated detection device is provided, the process for the fabrication of which is simplified and hence the sensitivity of which is improved.

According to one aspect, an electronic detection device is provided, comprising: a detection stage including an insulating region configured to receive an element to be detected and an electrically conductive region, the insulating region being positioned above the electrically conductive region; a biasing stage configured to bias said electrically conductive region by capacitive coupling; and a detection module having an input interface that is electrically coupled to said electrically conductive region and configured to detect a variation in potential on said interface in the presence of said element on the insulating region. The electrically conductive region includes a lower part that is coupled to said input interface, an upper part that is located below said insulating region and a linking part between the lower and upper parts. The biasing stage includes an additional insulating layer extending on either side of the linking part between said lower part and said upper part, and at least one first additional electrically conductive region that is located level with said lower part and is capacitively coupled with said upper part via the additional insulating layer.

Thus, by producing the additional region level with the lower part, the upper part may be biased from below by capacitive effect.

The absence of a biasing circuit on the detection surface allows a larger detection area to be obtained.

Furthermore, the process for producing such a biasing circuit does not require any additional process steps above the insulating region, as will be seen below. Contamination of or damage to the insulating region is thus avoided.

According to one embodiment, the device is incorporated in an integrated circuit including a substrate surmounted by an interconnection part including multiple metallization levels, multiple via levels and intermetal insulating layers between the various metallization levels, wherein said lower part includes a first metal portion of a metallization level and said at least one additional region includes at least one additional metal portion that is located at said metallization level, said first metal portion and said at least one additional metal portion being separated by a zone of insulating material.

Said metallization level is advantageously the last metallization level of the interconnection part.

According to one embodiment, the upper part comprises a second metal portion, the linking part is a part that is analogous to a via, and the additional insulating layer is analogous to an intermetal insulating layer part.

The device may include a detection module which comprises at least one transistor, the gate of which is coupled to the input interface, and said at least one first additional region may be coupled to another terminal of the detection module.

The biasing stage may further include a second additional region that is located level with said lower part and is capacitively coupled with said upper part via the additional insulating layer.

Thus, it is possible to bias the input interface by capacitive effect via two capacitances, formed by the upper part, the first insulating layer, and the two additional regions.

This allows the input terminal to be more uniformly biased.

The device may comprise a biasing circuit that is configured to bias the first additional region and/or the second additional region.

According to one aspect, a system is provided comprising a device such as described above and a means for delivering the result, the system potentially being, for example, a pH meter.

According to another aspect, a process for producing a detection device is provided, including: producing a detection stage comprising production of an insulating region that is configured to receive an element to be detected and of an electrically conductive region; producing a biasing stage that is configured to bias said electrically conductive region by capacitive coupling; and producing a detection module possessing an input interface that is electrically coupled to said electrically conductive region and configured to detect a variation in potential on said interface in the presence of said element on the insulating region. Producing the electrically conductive region includes producing a lower part that is coupled to said input interface, an upper part that is located below said insulating region and a linking part between the lower and upper parts. Producing the biasing stage includes producing an insulating layer extending on either side of the linking part between said lower part and said upper part, and at least one first additional electrically conductive region level with said lower part and capacitively coupled with said upper part via the insulating layer.

Thus, any production step above the insulating region is avoided, thereby advantageously allowing its integrity to be conserved.

According to one mode of implementation, the biasing circuit is coupled to the first additional region.

According to one mode of implementation, the device includes an integrated circuit including a substrate surmounted by an interconnection part including multiple metallization levels, multiple via levels and intermetal insulating layers between the various metallization levels, wherein producing said lower part includes producing a first metal portion in a metallization level; and wherein producing said at least one first additional region includes at least one operation of producing a first additional metal portion located in the metallization level, the process further comprising depositing an insulating material between said metal portion and at least one additional metal portion.

Producing the detection stage may include: producing the additional insulating layer covering the lower part, and covering at least one part of said at least one additional region; locally etching the additional insulating layer so as to produce an etched zone which exposes a part of the lower part; depositing a conductive layer so as to cover the additional insulating layer, and so as to fill in the etched zone to form the linking part; depositing a second insulating layer so as to cover said conductive layer; etching of the second insulating layer and of the conductive layer apart from a zone centered on the lower part, which comprises the lower part and at least one part of said at least one additional region.

A second additional electrically conductive region that is located level with said lower part and is capacitively coupled with said upper part via the insulating layer may also be produced.

BRIEF DESCRIPTION OF THE DRAWINGS

Other advantages and features of the invention will become apparent upon examining the detailed description of modes of implementation and embodiments of the invention, which are in no way limiting, and the appended drawings, in which:

FIG. 1, described above, illustrates a detection device of the prior art;

FIGS. 2 and 2A show cross-sections of an electronic detection device;

FIGS. 3 to 6 illustrate exemplary process steps for fabricating the device of FIG. 2.

DETAILED DESCRIPTION

Figure 2A:
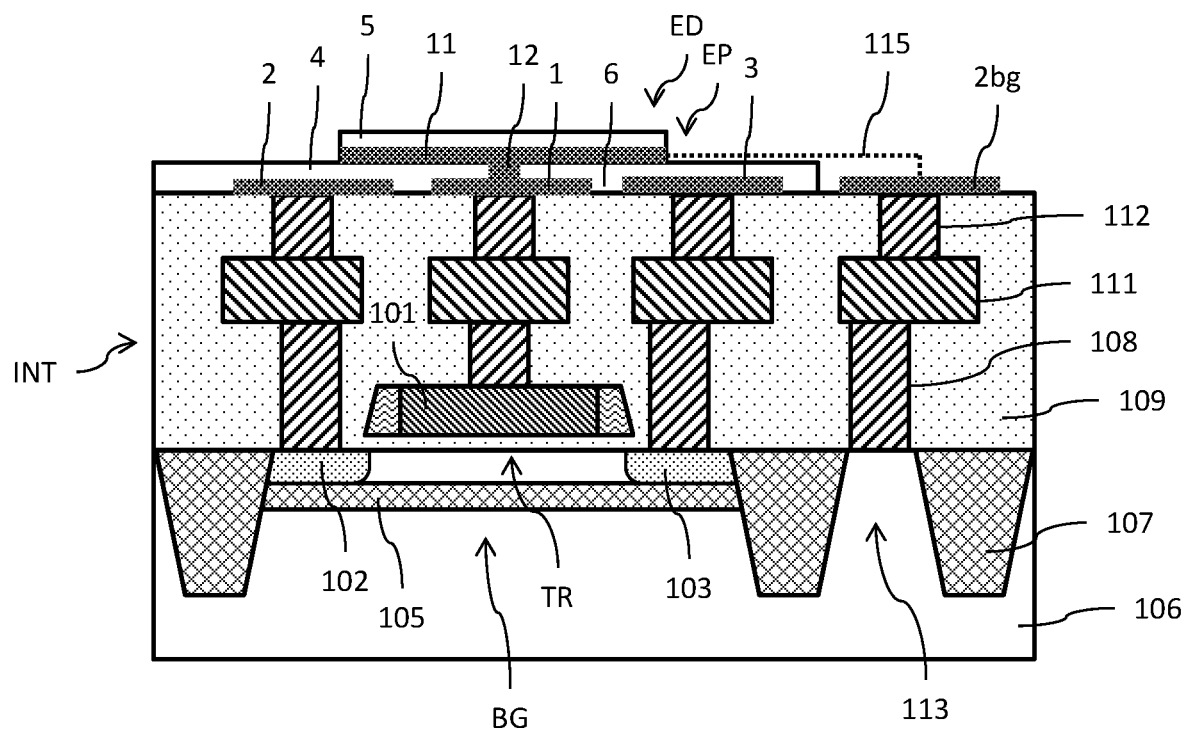

In FIG. 2, the reference DIS denotes an electronic detection device including a substrate Sb surmounted by an interconnection part INT (BEOL). This interconnection part conventionally includes, in a known manner, metallization levels, separated by intermetal dielectric regions, and linked by via levels. The vias connect metal tracks of adjacent metallization levels.

The device DIS includes a detection module MD including one or more electronic components, and is configured to detect a variation in potential on an input interface IE of the detection module MD.

For example, the detection module MD may comprise a MOS transistor TR, the gate of which forms the input interface IE.

It would also be possible for the input interface to be formed by a back gate of a MOS transistor produced using silicon-on-insulator (SOI) technology, by a protection diode coupled to a gate or to a back gate of a MOS transistor, or else by the gate of a bipolar transistor.

A person skilled in the art will select the most suitable embodiment according to the envisaged application.

The device further includes a detection stage ED, coupled to the input interface IE and configured to receive a product to be analyzed, said product bringing about said variation in potential on the input interface IE.

The detection stage ED includes an electrically conductive region 10, including here an electrically conductive lower part 1, produced here at the last metallization level Mn of the interconnection part INT, i.e. here in the metal level furthest from the substrate, and electrically coupled to an upper part 11, produced above the lower part 1, by a linking part 12.

The upper part 11 may resemble a metal track of a metallization level which would be above the level Mn.

The linking part 12 may then resemble a via between these two metal tracks.

The detection stage ED further includes an insulating region 5 produced on the upper part 11 which includes here a dielectric material, for example aluminum oxide.

The upper part 11 and the insulating region 5 are produced here with coincident profiles so as to extend over one and the same area of the integrated circuit CI.

The insulating region 5 forms a detection surface of the device DIS and is capable of receiving any element to be analyzed, for example a liquid, for the purpose of measuring pH, of detecting a molecule, or for any other application suitable for biological detectors, and of transmitting a variation in potential caused by said liquid to the input interface IE of the detection module.

The presence of the liquid on the insulating region 5 varies the potential on the input interface by capacitive effect.

The detection device DIS further includes a biasing stage EP that is configured to bias the electrically conductive region 10.

The biasing stage EP includes two additional electrically conductive regions 2 and 3, which are produced at the last metallization level Mn of the interconnection part INT, i.e. level with the lower part 1, and an insulating layer 4.

The insulating layer 4 covers the first additional region 2 and the second additional region 3. The layer 4 comprises a dielectric material, for example here silicon dioxide. The layer 4 extends on either side of the linking part 12 and partly between the lower part 1 and the upper part 11.

The insulating layer 4 resembles here an intermetal dielectric material layer.

Here, the upper part 11 and the insulating region 5 extend above a rectangular zone Z which is centered on the lower part 1, and which includes the lower part 1, a part of the first additional region 2 and a part of the second additional region 3.

The device therefore features a superposition of a portion of the first additional region 2, of a portion of the insulating layer 4, and of a portion of the upper part 11.

Analogously, the device features a superposition of a portion of the second additional region 3, of a portion of the insulating layer 4, and of a portion of the upper part 11.

The first additional region 2 and the second additional region 3 are therefore capacitively coupled with the electrically conductive region 10 via the insulating layer 4. Furthermore, the first additional region 2 and the second additional region 3 are respectively electrically connected, through the interconnection part INT, to the source and drain of the transistor TR for the detection module MD. See, FIG. 2A. The transistor TR includes a gate 101 over a semiconductor layer which includes a source 102 and drain 103. The semiconductor layer is part, for example, of a silicon on insulator (SOI) substrate which includes a buried oxide layer 105 and support substrate 106. The active area of the transistor TR is delimited by shallow trench isolations 107. Metal contacts 108 extend through a dielectric layer region 109 of the interconnection part INT to contact the gate 101, source 102 and drain 103. The interconnection part INT further includes one or more metallization levels which include metal lines 111 and vias 112. Only one metallization level is shown as an example, but it will be understood that more than one layer may be included. The detection stage ED is formed at the uppermost metallization level of the interconnection part INT and includes the lower part 1 and additional regions 2 and 3. The upper part 11, produced above the lower part 1, is electrically connected by a linking part 12 to the lower part 1. Insulating region 5 covers the upper part 11 and insulating regions 4 and 6 separate the additional regions 2 and 3 from the lower part 1, upper part 11 and linking part 12.

The shallow trench isolations 107 further delimit a semiconductor sinker 113 which supports the making of an electrical connection to the support substrate 106. This electrical connection supports the making of an electrical connection to back gate BG of the transistor TR. The detection stage ED is formed at the uppermost metallization level of the interconnection part INT may further include an additional region 2bg which is electrically connected through vias 112, metal lines 111 and contacts 108 to the semiconductor sinker 113. In an embodiment, the upper part 11 may be electrically connected to the additional region 2bg as schematically indicated at reference 115 so that the input interface can be formed as well by the back gate BG of the MOS transistor TR.

To allow a variation in potential at the input interface, caused for example by the presence of a liquid to be analyzed placed on the insulating region 5, to be measured, it is preferable to have knowledge of the initial potential on the input interface IE, and hence that this potential is not floating.

To this end, the device DIS includes biasing circuit MP that is coupled to one or more of the first additional region 2 and the second additional region 3, for example by means of vias and metal tracks of the interconnection part INT.

For example, the biasing circuit MP may comprise a power supply terminal that is configured to be coupled to a power supply source delivering a reference voltage. The biasing circuit MP is configured here to deliver a voltage of one volt.

It would be possible for the zone Z not to extend over the second additional region 3. In this case, the biasing stage would be capacitively coupled with the conductive region 10 solely via the second additional region 2.

The lower part 1, the first additional region 2 and the second additional region 3 are separated from one another by an insulating material, for example here silicon oxide 6.

The lower part 1 is coupled to the gate of the MOS transistor TR. The first additional region 2 and the second additional region 3 are here coupled to other terminals of the detection module MD, for example here, but nonlimitingly, to the drain and to the source of the MOS transistor TR, respectively.

The biasing circuit MP is therefore here configured to bias the electrodes of the MOS transistor TR.

It would be possible, however, for the first and second additional regions 2 and 3 not to be coupled to any terminal of the detection module MD, or for only one to be coupled to the detection module MD.

The lower part 1, the first additional region 2 and the third additional region 3 are coupled to the detection module MD via metal tracks and vias of the interconnection part (not shown for reasons of simplification).

Thus, it is possible to bias the input interface IE, i.e. here the gate of the MOS transistor TR of the detection module MD via capacitive coupling between the additional regions 2 and 3 and the upper part 11.

This advantageously makes it possible to avoid the input terminal of the device DIS being floating.

Furthermore, the biasing via the additional regions 2 and 3, which are produced at the last metal level of the interconnection part INT, and hence below the insulating region 5, advantageously makes it possible to increase the area dedicated to detection with respect to a detection surface on which an electrode has been produced, as described above in conjunction with FIG. 1.

The inventors have observed that such a detection device may be up to three times more sensitive than a device of the prior art.

FIGS. 3 to 6 illustrate exemplary process steps for fabricating the device DIS described above in conjunction with FIG. 2.

Figure 3:
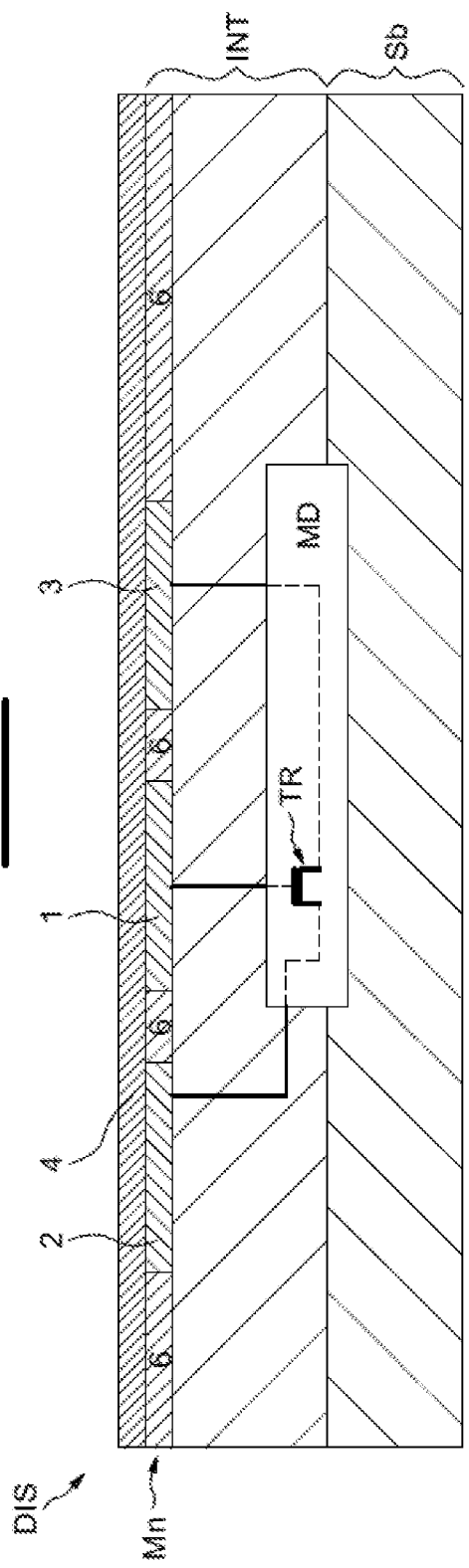

FIG. 3 shows the detection module during fabrication. The substrate Sb, the detection module MD, the interconnection part INT, the lower part 1, and the additional regions 2 and 3 have been produced via conventional fabrication steps, which will not be described in detail for reasons of simplification.

Terms such as "first step", "second step", etc. therefore relate solely to the process steps carried out after said conventional steps, and not to the actual first and second steps of the process for fabricating the device DIS.

In the conventional steps of producing the detection module MD and the interconnection part INT, the biasing circuit MP has been coupled to the first additional region 1 and to the second additional region 3 by means of vias and metal tracks of the interconnection part INT.

In a first process step illustrated in FIG. 3, the first insulating layer 4, comprising here silicon nitride, has been deposited so as to cover the lower part 1, the additional regions 2 and 3, and the insulating material 6.

For example, the deposition of the first insulating layer 4 may comprise steps of chemical vapor deposition (CVD) and steps of chemical-mechanical polishing.

A person skilled in the art will select the most suitable methods for the deposition of the layers of material of the fabrication process described here.

It should be noted here that the figures illustrate the device schematically, and that in practice the insulating layer 4 does not necessarily extend over the entirety of the area of the device.

For example, it would be possible for the device DIS to comprise metal tracks that are located in the same metallization level as the lower part 1 and as the additional regions 2 and 3, and for the insulating layer 4 not to cover these metal tracks.

Figure 4:
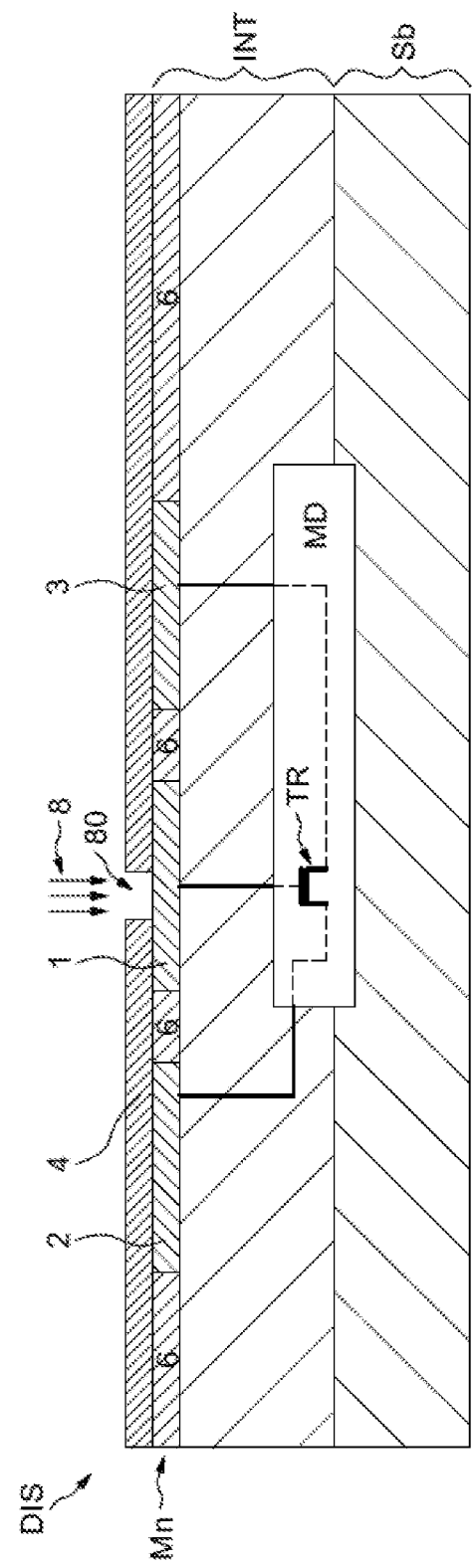

In a second process step illustrated in FIG. 4, the first insulating layer 4 is locally etched 8, above a portion of the lower part 1, so as to produce an etched zone 80 which exposes said portion of the lower part 1.

The local etch may be achieved for example by means of one or more photolithography steps employing etching masks, for example made of resist, followed by plasma etching.

Next (FIG. 5), a conductive material 110, preferably a conductive material identical to that forming the lower part 1, here copper or aluminum, is deposited.

The deposition is carried out such that it fills the etched zone 80, so as to form the linking part 12, and such that it covers at least the entirety of the first insulating layer 4 so as to form a conductive layer 110.

Next, a second insulating layer 50 is produced by depositing a dielectric material, here aluminum oxide, so as to cover the conductive layer 110.

In a last step (FIG. 6), the second insulating layer 50 and the layer 110 are etched 9, with the exception of the rectangular zone Z centered on the lower part 1, which comprises the lower part 1, a part of the first additional region 2, and a part of the second additional region 3.

However, it would be possible for the zone Z not to comprise any part of the second additional region 3. In this case, the biasing circuit MP is not coupled to the second additional region.

This etch delimits the insulating region 5 in the second insulating layer 50, and the upper part 11 in the first conductive layer 11.

The detection device such as described above may be incorporated in any type of system containing a detection device and means, for example display means MAF, for delivering the detection result.

Figure 7:
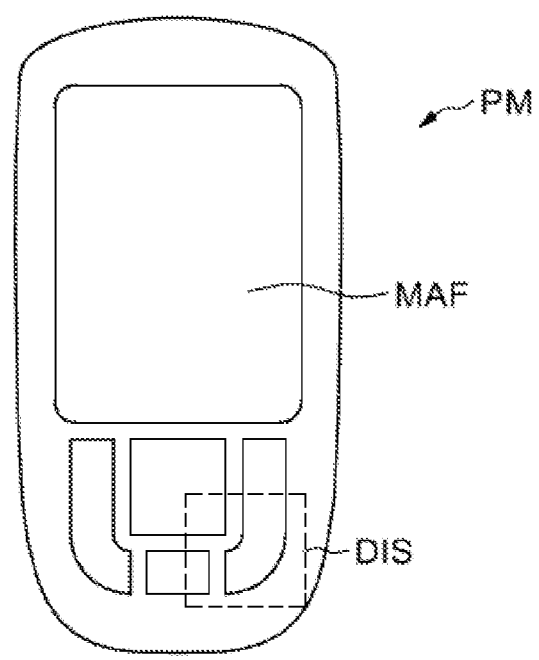
FIG. 7 illustrates a system, for example a pH meter, which includes the device.

The system may be for example a pH meter PM, such as illustrated in FIG. 7.

The invention claimed is:

1. An electronic detection device, comprising:
   a detection stage including an insulating region configured to receive an element to be detected and an electrically conductive region, the insulating region being positioned above the electrically conductive region;
   a biasing stage configured to bias said electrically conductive region by capacitive coupling; and
   a detection module having an input interface that is electrically coupled to said electrically conductive region, the detection module configured to detect a variation in potential on said input interface in the presence of said element on the insulating region;
   wherein the detection module comprises at least one transistor having a front gate that is electrically connected to the input interface to receive said variation in potential on the input interface and a back gate that is also electrically connected to the input interface to receive said variation in potential on the input interface;
   wherein the electrically conductive region includes a lower part that is coupled to said input interface, an upper part that is located below said insulating region and a linking part between the lower and upper parts; and
   wherein the biasing stage includes an additional insulating layer extending on either side of the linking part between said lower part and said upper part, and at least one first additional electrically conductive region that is located level with said lower part and which is capacitively coupled with said upper part via the additional insulating layer.

2. The device according to claim 1, incorporated in an integrated circuit including a substrate surmounted by an interconnection part including multiple metallization levels, multiple via levels and intermetal insulating layers between the various metallization levels, wherein said lower part includes a first metal portion of a metallization level and said at least one first additional electrically conductive region includes at least one additional metal portion that is located at said metallization level, said first metal portion and said at least one additional metal portion being separated by a zone of insulating material.

3. The device according to claim 2, wherein said metallization level is an upper-most metallization level of the interconnection part.

4. The device according to claim 3, wherein the upper part comprises a second metal portion, the linking part is a part that is analogous to a via, and the additional insulating layer is analogous to an intermetal insulating layer part.

5. The device according to claim 1, wherein the detection module comprises at least one transistor having a gate that is electrically connected to the input interface, and wherein said at least one first additional electrically conductive region is electrically connected to another terminal of the detection module.

6. The device according to claim 1, further including a biasing circuit configured to bias said at least one first additional electrically conductive region of the biasing stage.

7. The device according to claim 1, wherein the biasing stage further includes a second additional electrically conductive region that is located level with said lower part and is capacitively coupled with said upper part via the additional insulating layer.

8. The device according to claim 1, wherein said at least one first additional electrically conductive region is electrically connected to one of a source or drain terminal of the at least one transistor.

9. The device according to claim 1, wherein the at least one transistor is supported by a silicon on insulator (SOI) substrate including a semiconductor layer with a source region and a drain region of said at least one transistor, a buried oxide layer and support substrate, and wherein the support substrate forms said further includes a back gate of said at least one transistor.

10. A system, comprising:
an electronic detection device configured to detect an element and generate a result of the detection, the electronic device comprising:
- a detection stage including an insulating region configured to receive an element to be detected and an electrically conductive region, the insulating region being positioned above the electrically conductive region;
- a biasing stage configured to bias said electrically conductive region by capacitive coupling; and
- a detection module having an input interface that is electrically coupled to said electrically conductive region, the detection module configured to detect a variation in potential on said input interface in the presence of said element on the insulating region;

wherein the detection module comprises at least one transistor having a front gate that is electrically connected to the input interface to receive said variation in potential on the input interface and a back gate that is also electrically connected to the input interface to receive said variation in potential on the input interface;

wherein the electrically conductive region includes a lower part that is coupled to said input interface, an upper part that is located below said insulating region and a linking part between the lower and upper parts; and wherein the biasing stage includes an additional insulating layer extending on either side of the linking part between said lower part and said upper part, and at least one first additional electrically conductive region that is located level with said lower part and which is capacitively coupled with said upper part via the additional insulating layer.

11. The system according to claim 10, wherein the result is indicative of a measured pH and wherein the system is a pH meter.

12. The system according to claim 10, wherein the electronic detection device is incorporated in an integrated circuit including a substrate surmounted by an interconnection part including multiple metallization levels, multiple via levels and intermetal insulating layers between the various metallization levels, wherein said lower part includes a first metal portion of a metallization level and said at least one first additional electrically conductive region includes at least one additional metal portion that is located at said metallization level, said first metal portion and said at least one additional metal portion being separated by a zone of insulating material.

13. The system according to claim 12, wherein said metallization level is an upper-most metallization level of the interconnection part.

14. The system according to claim 13, wherein the upper part comprises a second metal portion, the linking part is a part that is analogous to a via, and the additional insulating layer is analogous to an intermetal insulating layer part.

15. The system according to claim 10, wherein the detection module comprises at least one transistor having a gate that is electrically connected to the input interface, and wherein said at least one first additional electrically conductive region is electrically connected to another terminal of the detection module.

16. The system according to claim 10, wherein the electronic detection device further includes a biasing circuit configured to bias said at least one first additional electrically conductive region of the biasing stage.

17. The system according to claim 10, wherein the biasing stage further includes a second additional electrically conductive region that is located level with said lower part and is capacitively coupled with said upper part via the additional insulating layer.

18. The system according to claim 10, wherein said at least one first additional electrically conductive region is electrically connected to one of a source or drain terminal of the at least one transistor.

19. The system according to claim 10, wherein the at least one transistor is supported by a silicon on insulator (SOI) substrate including a semiconductor layer with a source region and a drain region of said at least one transistor, a buried oxide layer and support substrate, and wherein the support substrate forms said back gate of said at least one transistor.

* * * * *

UNITED STATES PATENT AND TRADEMARK OFFICE
CERTIFICATE OF CORRECTION

PATENT NO. : 10,794,856 B2
APPLICATION NO. : 16/275051
DATED : October 6, 2020
INVENTOR(S) : Getenet Tesega Ayele et al.

It is certified that error appears in the above-identified patent and that said Letters Patent is hereby corrected as shown below:

In the Claims

At Column 8, Line 66, Claim No. 9, please delete the phrase "further includes a".

Signed and Sealed this
Fifteenth Day of June, 2021

Drew Hirshfeld
*Performing the Functions and Duties of the
Under Secretary of Commerce for Intellectual Property and
Director of the United States Patent and Trademark Office*